METHOD OF AND APPARATUS FOR MAKING PRINTED CIRCUITS

Filed Aug. 31, 1956

INVENTORS:
STANISLAW J. SZPAK,
BERNARD DARREL,
BY Charles M. Hutchins
THEIR ATTORNEY.

2,966,429

METHOD OF AND APPARATUS FOR MAKING PRINTED CIRCUITS

Bernard Darrel, Pittsfield, Mass., and Stanislaw J. Szpak, Philadelphia, Pa., assignors to General Electric Company, a corporation of New York Filed Aug. 31, 1956, Ser. No. 607,511

3 Claims. (Cl. 117—212)

Figure 1:
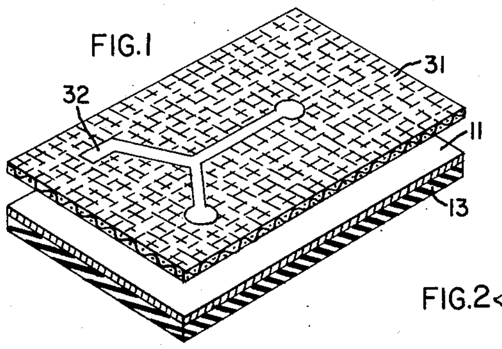

This invention generally relates to electrical circuit fabrication, and more particularly to processes for making a prefabricated electrical conducting circuit, commonly termed a "printed" circuit. The invention described in this application is a continuation-in-part of application Serial No. 534,476 filed September 15, 1955, now abandoned, entitled—"Method and Apparatus for Making Printed Circuits," S. J. Szpak and B. Darrel, inventors; assigned to the same assignee as the present application.

In a prior application of the same inventors, Serial No. 526,162, now U.S. Patent No. 2,910,351, there is disclosed an improved printed circuit and process wherein an image of dust is electrostatically formed in a desired predetermined pattern configuration on a specially formed "master," and this dust image is then transferred to cover similar portions of the conducting surface of a chassis and form a protective coating thereon. By covering these conducting chassis portions in a desired configuration, the remaining conducting portions of the chassis are then readily removed; and thereafter, upon removing this dust image, the desired printed circuit pattern is formed.

In accordance with one aspect of the present invention, a nonconducting dust image is directly formed over the conducting surface of the chassis by a mask process rather than being initially formed on a master and later transferred to the chassis, as in the prior application. Thereafter, the chassis with the dust image thereon is treated in the same manner as in the prior application, to yield the desired printed circuit wiring configuration.

It is accordingly one object of the present invention to provide a process of fabricating a given configuration of electrical conductors on a chassis that is both faster and less expensive than prior processes.

Other objects and many attendant advantages of this invention will be more readily comprehended by those skilled in this art upon a detailed consideration of the following specification, taken in connection with the accompanying drawings, wherein like parts in each of the several figures have been given the same reference numeral, and wherein:

Figs. 1–6 inclusive, are perspective views illustrating the various steps in performing one preferred embodiment of the present invention.

A preferred embodiment of the invention is illustrated in Figures 1 through 6 of the drawings. In practicing this embodiment of the invention, a chassis member is provided which comprises an insulating member 13 having a conductive surface 11 formed thereon. The conductive surface 11 may comprise a thin copper or silver foil adhered to the insulating member 13 by a suitable adhesive, or may comprise a deposited layer of silver, nickel or the like formed on the insulating member 13 by a suitable plating or other deposition process. The insulating member 13 may comprise any plastic such as phenolic having the dielectric and physical characteristics required to make it suitable for use as a backing member for printed circuit applications.

Figure 2:
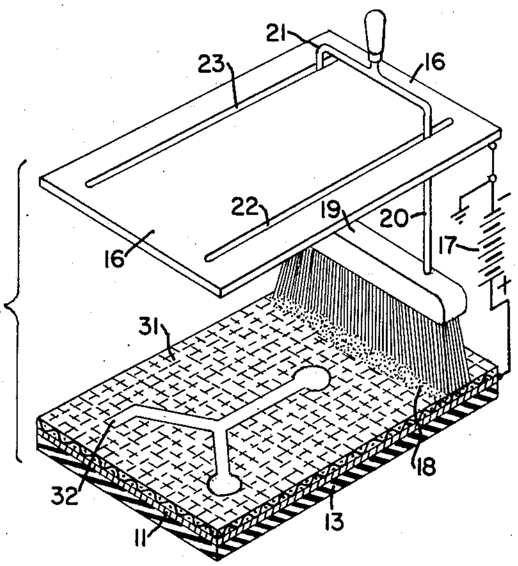

As is best shown in Fig. 2, the combined chassis member formed by insulating member 13 and conductive surface 11 has a mask 31 disposed thereover which preferably comprises a silk screen having a portion 32 thereof blanked out to define the desired printed circuit configuration. In practicing this embodiment of the invention, a source of electric potential 17 has the positive terminal thereof connected to the conductive surface 11 so as to apply a positive potential thereto, and its negative terminal is connected to ground. With the chassis member connected in this manner, finely divided dust or powder 18 formed from material which is susceptible to being electrically charged, is deposited on the mask 31, and is spread over the entire mask by a suitable brushing arrangement. This brushing arrangement comprises a brush 19 having conductive handle portions 20 and 21 that are adapted to ride in guide slots 22 and 23 formed in a conductive plate 16. The conductive plate 16 is connected to the negative terminal of potential source 17 so that the brush, and, hence the particles of dust 18, are given a negative electric charge. With this arrangement, the negatively charged dust particles 18, as they are spread over the mask 31, pass through the open interstices in the mask 31, and adhere to the positively charged conductive surface 11. In the areas 32 where the mask 31 is blanked out to form the desired printed circuit configuration, the dust particles 18 do not pass through the mask 31. Next, the power source 17 is removed and mask 31 is lifted upward and away from the chassis conducting surface 11. Consequently, upon removal of mask 31, the chassis member is left in the form shown in Figure 3 wherein most of the conductive surface 11 is covered over by a dust particle image 33 except the desired printed wiring configuration which is left void thereby exposing the underlying conductive surface 11.

In a subsequent step of the process, the mask 33 is affixed to the conductive surface 11 by heating the deposit of dust or powder particles by means of heat lamps 25. This heating melts the dust particles, thereby more permanently affixing the dust image 33 to the conductive surface 11. If desired, the dust particles could be heated by means other than the heat lamps 25, such as in a furnace, or they could be more permanently affixed to the conductive surface 11 by a suitable solvent vapor fusion technique to be described more fully hereinafter.

Subsequent to affixing the dust image 33 to the conductive surface 11 of the printed circuit chassis member, the chassis member is inserted in a suitable plating bath. For example, an electroplating facility may be used by merely connecting one terminal of the facility to the underlying conductive surface 11 of the chassis member, to form one electrode, and connecting the remaining electrode of the facility to a source of metal, for example copper or the like, to form the remaining electrode. In this stage of the process, additional metal, which may be dissimilar from the conductive surface 11, is deposited onto the conductive surface 11 of the printed circuit chassis member in those areas left void by the dust image 33, and the affixed dust image 33 serves as a resist to prevent deposition of the additional conductive material on any other part of the conductive surface 11. As a result of this operation, the printed circuit chassis member is left with the portions on the conductive surface 11 thereof not covered by the dust image 33 filled with additional conductive material 34 deposited in the configuration of the desired printed circuit.

Figure 5:
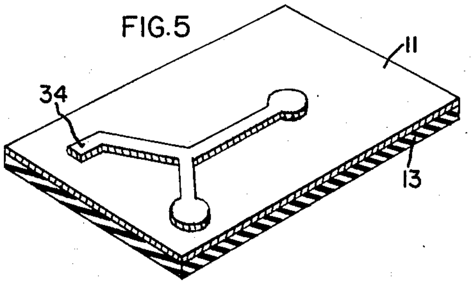

Subsequent to depositing the additional metal 34 on the printed circuit chassis member, the chassis member is immersed in a suitable solvent that attacks the affixed dust image 33 to remove the same thereby leaving the chassis member in the condition shown in Figure 5 of the drawings. At this stage of the process the chassis member includes the insulating backing member 13 having its entire surface covered with the conductive surface 11, with the conductive surface 11 in turn being covered on the portions thereof where it is desired that the printed circuit configuration be formed, with an additional conductive material 34.

Figure 6:
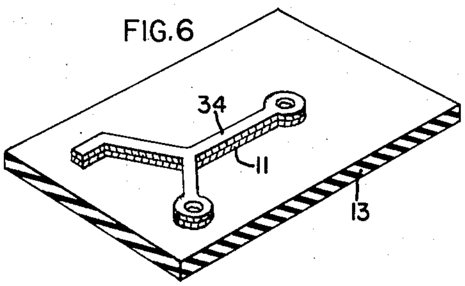

In one manner of practicing this embodiment of the invention, assuming the additionally deposited conductive material 34 to be dissimilar from material out of which the conductive surface 11 was formed, the chassis member in the condition shown in Figure 5 is immersed in a chemical solution which chemically attacks the conductive surface 11 but not the additionally deposited conductive material 34. The chemical solution then chemically attacks the exposed portions of the conductive surface 11 not covered by the additional deposited conductive material 34 for a sufficient period of time to remove all of such exposed portions of the conductive surface 11. This action then results in a completed printed circuit board as shown in Figure 6 of the drawings. Additional techniques for removing the uncovered portions of the underlying conductive surface 11 are well known in the art, and, if desired, may be employed in place of the chemical removal described above. Irrespective of the manner of removal, however, by this final removal operation the desired printed circuit is completed since the predetermined printed circuit configuration initially formed by the blanked out portions 32 of mask 31 has been reproduced in the form of a conducting pattern 34 over the surface of the non-conducting insulating backing member 13.

*Detailed materials and procedure*

Considering each of the steps of the above briefly described processes in greater detail, the preferred materials employed, and the manner of performing these operations, is set forth hereinafter. The nonconducting chassis used in each of these processes may be comprised of upper and/or lower layers of conducting material such as copper, silver, a lead-tin alloy, nickel, and the like which may be in the form of a foil or a deposited layer of metal, and which may be dissolved or etched in a solvent. The nonconducting board may be of a material of natural origin, or a composition having the property of being nonconducting, being a suitable dielectric, and possessing sufficient strength, rigidity, and other properties that may be needed, depending upon the ultimate use of the printed circuit. Chassis boards or sheets of phenolic composition of thicknesses in the order of 1/16 inch have been successfully used, together with metal layers of thicknesses in the order of .003 inch. However, as is obvious to those skilled in this art, the materials selected and the thicknesses of these materials may be varied to suit a particular application of the printed circuit, and may cover a wide range of varying materials and thicknesses, depending upon the electrical and mechanical properties needed for such application.

The dusting material employed to form the dust image may be any one of a group of dielectric substances, such as powdered waxes and resins of natural origin, or plastic powders, preferably of low melting point and having the property of being easily polarized in electric fields, and thereby attracting to either a positively or negatively charged surface. This dust material should also be nonsoluble in a solvent that dissolves portions of the plated conducting layer 34 of the chassis. On the other hand, this material should also be soluble in a suitable solvent or dissolving agent that does not affect this conducting layer. Among the various materials having the above characteristics, the pulverized resins, including gum copal, sanderac, and in particular gum arabic, have been found suitable. For best results, the dust powder should be quite finely divided. For example, powders made up of particles having diameters in the range of 25–75 microns have been found to be quite satisfactory. The following list of dusting materials were investigated, and were determined to produce desirable results.

(*a*) Ester Gum 8L—manufactured by the Hercules Powder Company. Chemical composition: glycerol ester of pale wood rosin; solvent: mineral spirits; softening point: 89°–96° C. Electrical properties: it appears to carry negative charge which does not change with electric field strength (up to 3,000 volts/cm.$^2$).

(*b*) Bakelite resin VYLF—manufactured by the Bakelite Co. Chemical composition: polyvinyl; solvent: ketones (acetone, methyl-ethylketone, etc.); melting point: 100° C. Electrical properties: it appears to carry a negative charge which is larger than that of Ester Gum 8L.

(*c*) Bakelite resin VYHH—manufactured by the Bakelite Co. Chemical composition: polyvinyl; solvent: ketones; melting point: 130° C.; electrical properties: it appears to carry positive and negative charge (deflected to the same extent toward negative and positive plates) which is similar in magnitude to that of VYLF.

(*d*) Ethyl cellulose—manufactured by the Hercules Powder Company. Chemical composition: ethyl cellulose; solvent: hot mineral oil; softening point: 100°–160° C. Electrical properties: it appears to carry positive charge.

(*e*) Xerox Developer—manufactured by the Haloid Company. Chemical composition: unknown; solvent: trichlorethylene; melting point: about 120° C.; electrical properties: it appears to carry a positive charge while in electric field strength up to 2000 volts/cm.$^2$ and at 3000 volts/cm.$^2$ it reverses its polarity and appears to exhibit a negative charge.

The mask 31 is preferably formed of a reticulated screen of silk or the like. In the embodiment of invention shown in Figs. 1–6, the interstices of the mask 31 in the desired printed circuit pattern are closed, and all other interstices are left open to allow resist dust to pass therethrough.

The magnitude of voltage potential employed to charge the surface of the chassis board for providing a sufficiently dense electrical field suitable for adhering the dust particles, like the materials discussed above, may fall within a wide range, depending upon the properties of the dusting material used, and whether the potential is used to charge a conducting surface or provide an electric field through a non-conductor. Greater potentials are, of course, required to pass an electric field through a non-conductor. Potentials in the range of magnitudes of 1000–2000 volts have been successfully used, but both lower and higher values have also been used with good results, depending upon the charge or field density desired for use with a particular dust composition, and depending upon the thickness and dielectric break-through properties of the nonconducting board.

Applying the dust particles to the charged surface of the chassis can be accomplished in any number of ways. The dusting is preferably accomplished by frictional brushing through the use of brushing means such as 19; however, other known means such as "cascade brushing," "magnetic brush dusting" or "cloud dusting," may be used instead. In the cascade dusting process, the powder acquires the desired electrostatic charge by contact with another powder, such as glass beads, iron filings, and the like, and the composite powder is moved across the surface of the mask by a force such as gravity. In the magnetic brush dusting process, very fine particles of magnetic material may be used as a carrier and this mixture of the magnetic material and plastic powder aligns itself in abrush-like form which, when swept across the screen and through the openings therein, adheres to the charged surface. In the third preferred form of applying this dust, termed cloud dusting, an air current blows the particles of dust into contact with the surface of the mask and through the openings in the mask to the charged surface of the chassis. Before blowing, this powder is preferably charged in an opposite polarity to that of the charged surface by either frictional means or by passing this powder through a corona discharge area.

Figure 3:
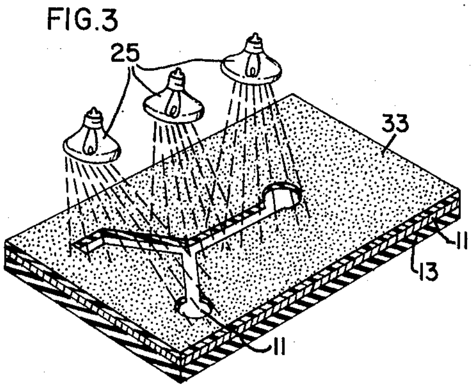
Figure 4:
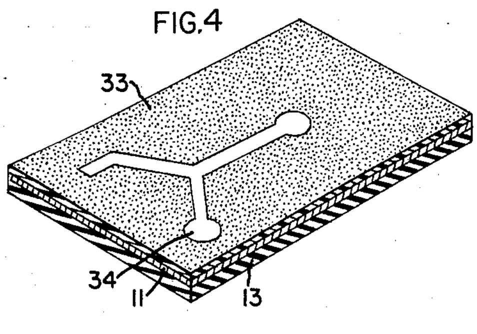

The dust image may be blended and affixed more permanently to the chassis surface in any one of a number of several ways, depending upon the type of dust used and the composition of the chassis. If wax or other soft and sticky materials are employed, the dust will be in some cases sufficiently adherred by pressure of the contact as it is brushed or sprayed through the mask openings and against the chassis surface, to provide a sufficiently permanent attachment. If a resin or wax dust is employed having a low melting point, the chassis may be heated momentarily to a temperature melting the resin or wax, thereby adhering this material more permanently and uniformly to the conducting layer of the chassis. This heating may also be accomplished by heat radiating electrical resistance elements, or as shown by Fig. 3, by infra-red rays generated by lamps 25. Alternatively, the dust pattern may be solidified by being baked in an oven or brought in the presence of a saturated solvent vapor, which blends the particles of dust together and adheres them to the surface of the chassis. In affixing this powder to the surface of the chassis by any one of the above-discussed methods, care should be taken to obtain a blended continuous surface of the dust particles free of pin-holes or other discontinuities. Such discontinuities are, of course, objectionable since they defeat the ultimate objective of obtaining a finely-defined or sharp outline of the printed circuit over the surface of the chassis.

In the next to final step of this embodiment of the invention (Figs. 1–6), the dust image is removed, leaving the remaining conducting surface of the chassis having the plated on conductor 34 thereon in the form of the desired printed surface pattern. For this purpose, a solvent may be employed that dissolves the dust material without affecting the remaining conductive members. If the dust image is of wax, various forms of a chlorinated hydrocarbon, gasoline or kerosene, may be employed. However, depending upon this composition of the dust and that of the conducting layer of the chassis, other solvents may, of course, be used for this purpose with equally good results.

*Conclusions*

For purposes of clearly illustrating the present invention, each of the process steps has been shown as separate and distinct operations that may be performed by hand. However, it is contemplated that many of these operations may be combined, and all of these operations mechanized to enable more rapid or inexpensive mass production or assembly-line fabrication of these printed circuits. For example, in practicing the invention, a chassis may be mechanically or electromechanically placed in a suitable chamber or the like, where it is charged with a suitable voltage potential and processed through a spraying and adhering device where it is covered with a dustor powder image in the desired pattern and the powder hardened. The chassis carrying this dust pattern may then be passed along on an assembly line and through two dissolving baths, the first bath removing the portions of the conducting material uncovered by the hardened dust image, and the second removing the dust image to yield the desired printed circuit underneath on the surface of the nonconducting portion of the chassis board.

It will be apparent to those skilled in the art that two conducting layers, one on each face of the chassis board, may be utilized to provide two separate and distinct printed wiring board circuits. This may be accomplished readily by processing each side of the chassis separately through the stage of affixing the resist dust to the chassis, and then carrying out subsequent operations in the process on both sides simultaneously.

Although a number of different materials and techniques for applying these materials have been specifically listed in this specification, such materials as may be employed in the product itself and in the means for applying these materials may take many other forms as well known to those skilled in the art. Applications Serial No. 479,622, now abandoned, and Serial No. 526,162, now U.S. Patent No. 2,910,351, assigned to the same assignee, disclose many alternative dust and solvent materials for example, as well as additional means for preparing the dust, precharging the dust, and affixing the dust that may be substituted with equally good results in the present process employing a mask for electrostatically forming a dust image directly on a chassis.

Since these and many other variations may be made, both in the individual steps and in the combination of these steps in carrying out the present invention in accordance with the teaching herein, it is intended that this invention be limited only in accordance with the following claims appended hereto.

What we claim as new and desire to secure by Letters Patent of the United States is:

1. The method of making a printed circuit comprising the steps of providing an electrically insulating member having an electrically conductive surface formed thereon, supplying an electric potential to said conductive surface, covering all portions of said conductive surface excepting portions in a predetermined configuration with an electrically neutral mask, applying a finely-divided powder formed from material susceptible to being charged in an electric field over the partially covered conductive surface thereby producing a powder design that adheres to the uncovered portions of the surface, removing the mask to leave a powder design in said predetermined configuration over the surface, affixing the powder design to the conductive surface to form a protective coating over predetermined areas thereof, coating the uncovered portions of the conductive surface chemically differentiating the predetermined circuit configuration from the areas on the insulating member where no conductive circuit configuration is desired, and subsequently removing the powder design to thereby form the desired printed circuit.

2. The method of making a printed circuit comprising the steps of providing a solid electrically insulating member having an electrically conductive surface formed thereon, supplying an electric potential to said conductive surface, covering all portions of said conductive surface with an electrically neutral mask where it is desired that no conductive circuit configuration be formed, applying a finely-divided powder formed from materials susceptible to being charged in an electric field over the partially covered conductive surface thereby producing a powder design that adheres to the uncovered portions of the chassis surface, removing the mask to leave a powder design in said predetermined configuration over the surface, affixing the powder design to the conductive surface to form a protective coating over predetermined areas thereof, applying additional electrically conductive material on the areas of said first mentioned conductive surface where no powder design is affixed, and removing the powder design and the portion of said first mentioned conductive surface not having additional material deposited thereon to form the desired printed circuit.

3. The method of making a printed circuit comprising the steps of: providing a chassis having an electrically nonconducting underlayer and an electrically conductive surface, electrically charging said conductive surface by connecting a source of electric potential thereto, covering said conductive surface with a mask having apertured portions where it is desired that no printed wiring configuration be formed, dusting said mask and exposed conducting surface portions with a powder susceptible to being electrically charged thereby producing a powder design that adheres to and covers the unmasked portion of said conductive surface, removing the mask to leave the powder design over the conductive surface, affixing the powder design to the conductive surface to form a protective coating the portions thereof where it is desired that no printed wiring configuration be formed, depositing an electrically conductive material dissimilar from said conductive surface on the portions of said conductive surface not covered by said affixed powder design, removing the powder design, and removing by chemical action the portions of the conductive metal not covered by said deposited dissimilar metal but not said dissimilar deposited conductive material nor the underlying portions of the conductive surface.

References Cited in the file of this patent

UNITED STATES PATENTS

| | | |
|---|---|---|
| 1,784,912 | Scott | Dec. 16, 1930 |
| 2,152,077 | Meston et al. | Mar. 28, 1939 |
| 2,297,691 | Carlson | Oct. 6, 1942 |
| 2,559,389 | Beeber et al. | July 3, 1951 |
| 2,600,343 | Tuttle | June 10, 1952 |
| 2,626,206 | Adler et al. | Jan. 20, 1953 |
| 2,728,693 | Cado | Dec. 27, 1955 |

FOREIGN PATENTS

| | | |
|---|---|---|
| 602,492 | Great Britain | May 27, 1948 |